(12) United States Patent
Koepsell

(10) Patent No.: US 9,131,617 B2
(45) Date of Patent: Sep. 8, 2015

(54) ELECTRICAL COMPONENT

(71) Applicant: Johnson Electric S.A., Murten (CH)

(72) Inventor: Martin Koepsell, Ennepetal (DE)

(73) Assignee: JOHNSON ELECTRIC S.A., Murten (CH)

( * ) Notice: Subject to any disclaimer, the term of this patent is extended or adjusted under 35 U.S.C. 154(b) by 210 days.

(21) Appl. No.: 13/861,095

(22) Filed: Apr. 11, 2013

(65) Prior Publication Data

US 2013/0269987 A1   Oct. 17, 2013

(30) Foreign Application Priority Data

Apr. 11, 2012 (DE) .......................... 10 2012 007 074

(51) Int. Cl.
| | |
|---|---|
| *H05K 1/00* | (2006.01) |
| *H05K 1/11* | (2006.01) |
| *H05K 3/00* | (2006.01) |
| *H05K 3/32* | (2006.01) |
| *H05K 1/18* | (2006.01) |

(52) U.S. Cl.
CPC .................. *H05K 1/118* (2013.01); *H05K 3/00* (2013.01); *H05K 3/328* (2013.01); *H05K 1/189* (2013.01); *H05K 2201/10636* (2013.01); *H05K 2203/0285* (2013.01)

(58) Field of Classification Search
CPC ............. H01K 1/02; H01K 1/11; H01K 1/16; H01K 1/147; H01K 3/222; H01K 3/328; H01L 23/4985; H01G 2/14; H01G 2/16; H01G 2/18; H01M 2/02; H01M 2/08; H01M 2/30

USPC .............. 174/252, 261; 429/53, 94, 175, 185; 361/523, 525; 29/25.03

See application file for complete search history.

(56) References Cited

U.S. PATENT DOCUMENTS

| | | | |
|---|---|---|---|
| 6,351,353 B1 * | 2/2002 | Sluzewski et al. ......... 360/294.3 |
| 6,653,018 B2 * | 11/2003 | Takahashi et al. ............ 429/185 |
| 6,699,780 B1 * | 3/2004 | Chiang et al. ................. 438/612 |
| 6,805,994 B1 * | 10/2004 | Shibamoto ..................... 429/94 |
| 6,989,982 B2 * | 1/2006 | Kobayashi et al. ........... 361/523 |
| 7,508,073 B2 * | 3/2009 | Nakamura et al. ............ 257/737 |
| 7,884,287 B2 * | 2/2011 | Gobl et al. .................... 174/261 |
| 8,481,199 B2 * | 7/2013 | Zama et al. ................... 429/175 |
| 2001/0038938 A1 * | 11/2001 | Takahashi et al. .............. 429/53 |
| 2007/0227767 A1 * | 10/2007 | Gobl et al. .................... 174/261 |
| 2009/0314522 A1 * | 12/2009 | Janesch et al. ................ 174/252 |

* cited by examiner

*Primary Examiner* — Xiaoliang Chen

(74) *Attorney, Agent, or Firm* — Muncy, Geissler, Olds & Lowe, P.C.

(57) ABSTRACT

In an electrical component having at least one flexible carrier material, the connecting surfaces formed on conductive pathways thereof are joined to the connecting surfaces of individual metal bodies via individual bonded connections. At least one rail profile is conformed in the surface structure of each bonded connection; each bonded connection having at least one ultrasonic welding bond. In order to produce the electrical component, individual metal bodies are arranged on the conductive pathways of a flexible carrier material. Connecting surfaces of the individual metal bodies and connecting surfaces of the conductive pathways are materially bonded to each other. One of the connecting surfaces to be bonded is produced from a foil that is fully furnished with conductive pathways, and energy directors made from aluminum are integrated in the conductive pathway or the metal body.

11 Claims, 3 Drawing Sheets

US 9,131,617 B2

ELECTRICAL COMPONENT

CROSS REFERENCE TO RELATED APPLICATIONS

This non-provisional patent application claims priority under 35 U.S.C. §119(a) from Patent Application No. 10 2012 007 074.8 filed in Germany on Apr. 11, 2012, which is incorporated herein by reference.

FIELD OF THE INVENTION

This invention relates to an electrical component and in particular, to an electrical component having a metal body joined to a conductive pathway of a flexible carrier material. The invention further relates to a method of making the electrical component.

BACKGROUND OF THE INVENTION

In the known electrical components, the bonded connections are realised as soldered joints or adhesive bonds, and ongoing development efforts are directed towards preventing the formation of dry joints and improving the load capacity of adhesive bonds. With soldered joints, a problem exists with regard to the thermal load on the flexible support material and of the components arranged thereon due to the heat of fusion that has to be applied to the solder. Flexible carrier materials that are able to withstand these thermal loads consist of thermally stable polyimides and other high-performance plastics, which are rather expensive to manufacture compared with other plastic films. Moreover, even small disturbances can result in the creation of "dry joints", which must be avoided at all costs for the purposes of the operating safety of electrical devices.

Adhesive bonds are associated with the problem of the reduced electrical conductivity of the adhesive compound itself, so that these bonds are not suitable for conducting larger electric currents. Moreover, the production of adhesive bonds is more time-consuming than creating soldered joints because the adhesive compounds have to be cured in separate work steps.

US patent application US2009/0314522 A1 discloses a multifunctional printed circuit board with a conductor structure created by etching to which electrically conductive wiring elements are secured by ultrasonic welding. For the multifunctional printed circuit board, rigid carrier materials are used such as fibre-reinforced plastics designed with mechanical strength and thermal stability properties that enable them to withstand the thermal loads and stresses caused by ultrasonic welding. However, conductive pathways made from flexible carrier materials are not suitable for the bonding process described in US2009/0314522 A1 because neither the flexible carrier material nor the intricate pathways arranged on them would withstand the thermal loads and stresses to which they would be exposed in an ultrasonic welding operation.

The object of the invention is therefore to describe an electrical component and a method of producing the electrical component that may be used to produce the joints between the conductive pathways and the metal bodies particularly reliably and also inexpensively.

SUMMARY OF THE INVENTION

Accordingly, in one aspect thereof, the present invention provides an electrical component comprising: a flexible carrier material having a connecting surface constructed on a conductive pathway; an individual metal body having a connecting surface joined to the connecting surface of the conductive pathway via an individual bonded connection, at least one rail profile conformed in the surface structure of the bonded connection, and the bonded connection has at least one ultrasonic welding bond.

The electrical component according to the invention differs from other components of the kind in that at least one rail profile is conformed in the surface structure of each bonded connection, and that each bonded connection comprises at least one ultrasonic joint. The rail profiles conformed in the surface structures have functioned as "energy directors" while the bonded connection was being created, limiting the area and length of the connecting surfaces that were joined to one another in the bonded connection. As a result of this limitation of the connecting surfaces, the ultrasonic weld may also be limited, so that the flexible carrier material and the conductive pathways formed thereon are undamaged by thermal and mechanical stresses when the weld is produced. The rail profiles that serve as energy directors thus ensure that ultrasonic welds are formed with advantageously low thermal and mechanical stress for the structures that surround the ultrasonic weld. The rail profiles in the surface structure of the bonded connection may be detected with micrographs.

According to a first refinement of the invention, the flexible carrier material includes at least one carrier film made from a thermoplastic plastic. The permanently flexible and insulating properties of thermoplastic plastics render them particularly suitable for use in automotive electrical applications. Thermoplastic carrier films can also be produced inexpensively.

According to a subsequent refinement of the invention, the conductive paths and the metal bodies are made from aluminium or an aluminium alloy at least in the area of their connecting surfaces. Aluminium is particularly well suited for creating ultrasonic weld joints. Aluminium is suitable for use as the conductive path. The ratio of conductivity to weight, which is decisive for lightweight construction, is considerably better than that of copper or silver.

The individual metal bodies are furnished with contacting elements in the form of male connectors or pushbutton sockets for example. The male connectors may be used particularly for connecting cable terminals, while the pushbutton sockets are provided to create pushbutton switches.

In order to further reduce the thermal load on the conductive pathways running on the flexible carrier material, the connecting surfaces of each of the pathways are furnished with peripherally extending cooling surfaces. Processing of conductive films with structured conductive pathways results in components that are ready to use immediately after the ultrasonic welding step. Compared with welding unstructured copper foils as described in US2009/0314522 (A1) and the many subsequent process steps associated therewith, this has considerable advantages for production. With the new method, components may be welded onto films that do not need any further processing steps to prepare them for use.

According to a second aspect, the present invention provides a method of arranging individual metal bodies on conductive pathways of a flexible carrier material in which connecting surfaces of the individual metal bodies and connecting surfaces of the conductive pathways are materially bonded with each other, particularly to produce an electrical component, comprising the steps of: forming one of the connecting surfaces to be joined by a film that is fully furnished with conductive pathways; forming energy directors made from aluminum integrated in the conductive pathway or the metal body; bringing the connecting surfaces that are to be bonded into engagement with the conductive pathways of the film as rail profiles; and welding together the contact surfaces that touch each other using ultrasonic vibrations. The ultrasonic vibrations cause the materials involved to take on a pasty consistency, which ultimately results in bonds that advantageously enable good electrical conductivity. The creation of dry joints is reliably prevented.

The rail profiles used in the method preferably function as energy directors.

The contact surfaces that are directly touching one another are subjected to at least one surface pressure application during the welding. This enables the creation of a reliable, bonded joint on the rail profiles by ultrasonic welding. At the same time, the connecting surfaces are preferably made from aluminium or an aluminium alloy, both of which lend themselves well to ultrasonic welding.

If the carrier material is placed on a metal plate during welding, this is an advantageous method for dissipating the heat.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
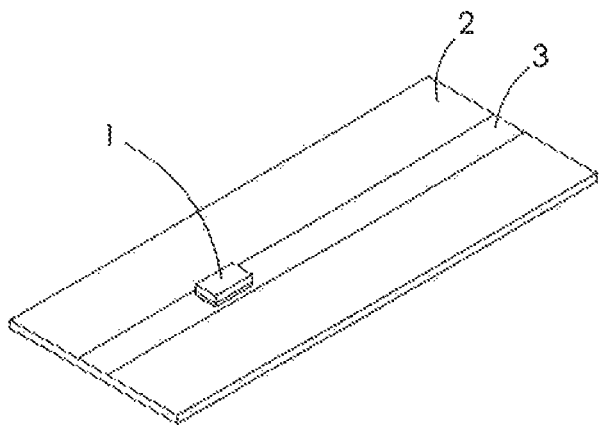
FIG. 1 is a perspective view of an electrical component having at least one flexible carrier material.

In the embodiment shown in FIG. 1, an approximately cuboid electrical component 1 is placed on a carrier material, of which only sections are shown, the carrier material being a carrier film 2. A rail profile 3 is indented in carrier film 2. Rail profile 3 is usually produced by joining the carrier film with a metal foil (e.g., copper, aluminium) adhesively and then removing selected areas of the metal by etching. Component 1 and rail profile 3 are welded to one another by ultrasonic vibrations.

Figure 2:
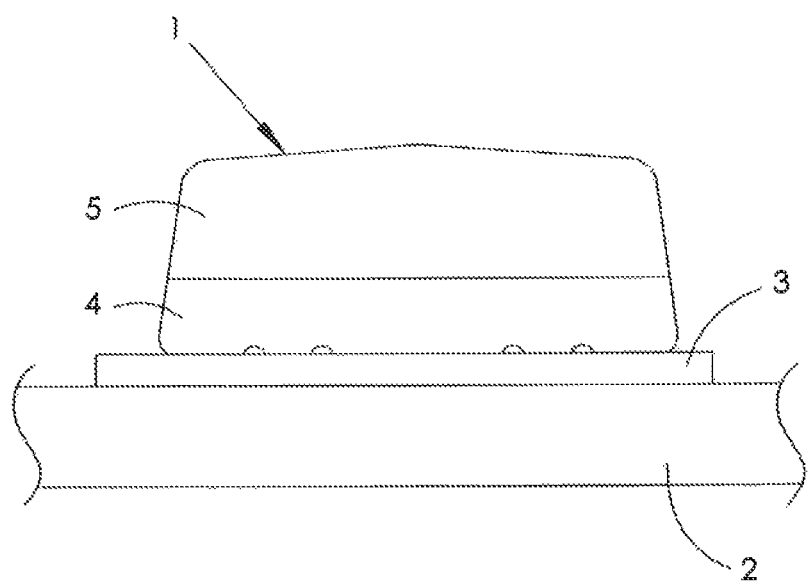
FIG. 2 is a side view of the component of FIG. 1 drawn to a larger scale.

FIG. 2 shows the welded state of component 1 and rail profile 3. Rail profile 3 is arranged on carrier film 2. Rail profile 3 may be joined to carrier film 2 for example by adhesion, an adhesive provided between rail profile 3 and carrier film 2 may also function as thermal insulation for the thermally vulnerable carrier film 2 when the ultrasonic vibrations are applied.

FIG. 2 shows that component 1, or at least parts thereof, are made from two different materials, in the area that is used for ultrasonic welding, that is to say the area facing towards rail profile 3, component 1 is made from an aluminium layer 4. Aluminium lends itself particularly well to use in ultrasonic weld joints, in other areas, uppermost in the figure, component 1 is constituted from a layer 5 of silver.

Figure 3:
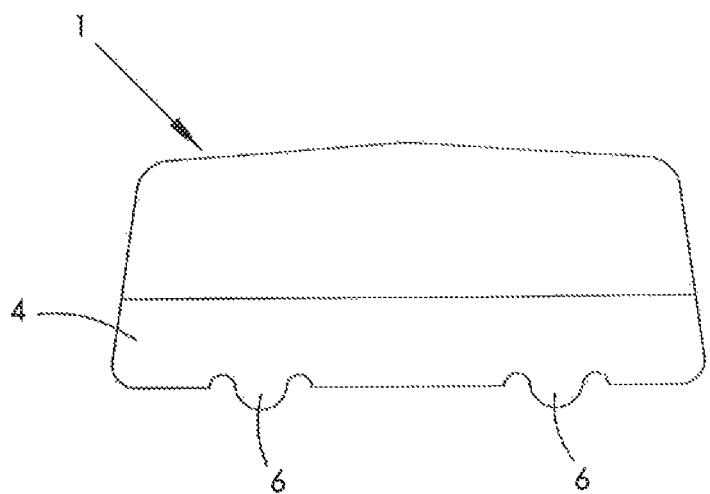
FIG. 3 is another side view of the component of FIG. 1 before it is placed on the carrier material.

FIG. 3 shows component 1 in an unbonded state, here projections 6 are visible on the underside of aluminium layer 4. Projections 6 form "energy directors", this is where the ultrasonic vibration energy is concentrated, and this is where the melting and transition to a plasma state starts. Projections of this kind may also be provided on rail profile 3.

Energy directors are formed even as early as the production of component 1 from the distinct elements silver and aluminium, as the ultrasonic vibrations in aluminium layer 4 result in increased heat generation. Other layers, which are subsequently added on top of silver layer 5, may then be applied by pressing processes for example.

The thickness of 2 carrier film may be <0.3 mm.

The bond between component 1 and carrier film 2 shown in FIG. 2 is ready for use immediately after ultrasonic welding. Subsequent processing is unnecessary.

Rail profiles 3 may also be made from carbon, in this case, a thin layer of carbon may be provided as an energy director, applied for example with the aid of an inkjet printer.

Figure 4A:
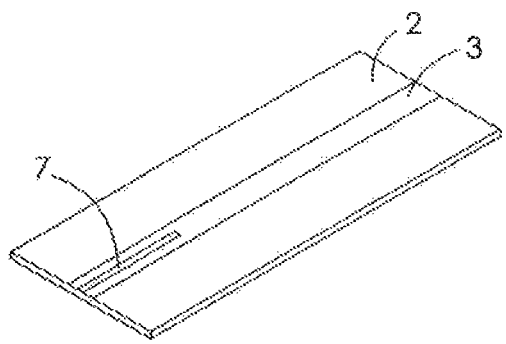
FIGS. 4a and 4b show another electrical component, again placed on a flexible carrier material.
Figure 4B:
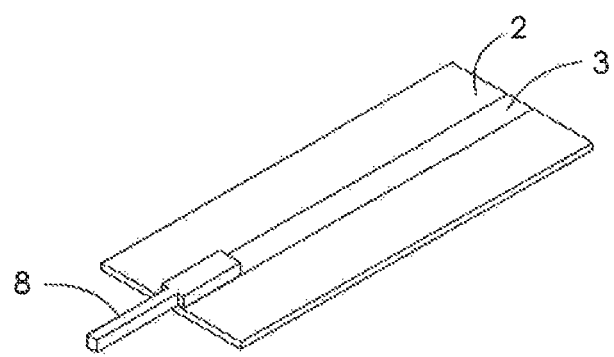

In the embodiment shown in FIGS. 4a and 4b, an additional layer 7 is deposited on rail profile 3. This additional layer forms the energy director for the ultrasonic vibrations.

Figure 5:
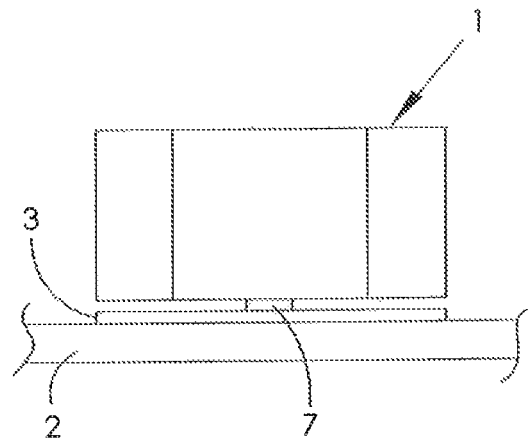
FIGS. 5 and 6 are cross sectional views of the component of FIG. 4 before and after it has been deposited on the carrier material.
Figure 6:
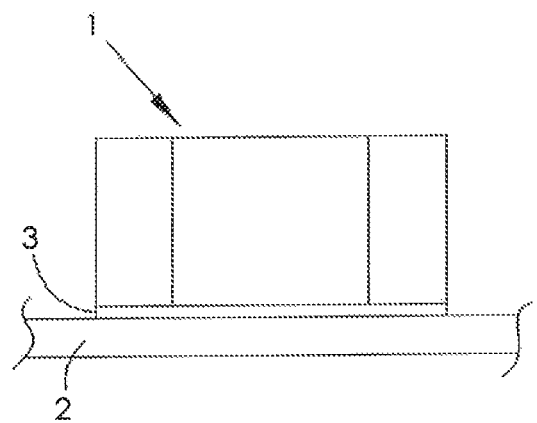

This additional layer 7 is also shown in FIG. 5. In the subsequent ultrasonic welding operation, the material of this additional layer 7 is integrated in rail profile 3; rail profile 3 and additional layer 7 are preferably made from the same material. Component 1 in FIG. 4b is furnished with a contacting element 8 in the form of a male connector.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. An electrical component comprising:
a flexible carrier material having a connecting surface constructed on a conductive pathway;
an individual metal body having a connecting surface joined to the connecting surface of the conductive pathway via an individual bonded connection,
at least one rail profile conformed in the surface structure of the bonded connection, and
the bonded connection has at least one ultrasonic welding bond,
wherein the individual metal body has a contacting element in the form of a pushbutton socket.

2. The electrical component of claim 1, wherein the flexible carrier material comprises at least one carrier film made from a thermoplastic plastic.

3. The electrical component of claim 1, wherein the conductive pathways and the metal bodies are constructed from aluminum or an aluminum alloy at least in the area of their connecting surfaces.

4. The electrical component of claim 2, wherein the conductive pathways and the metal bodies are constructed from aluminum or an aluminum alloy at least in the area of their connecting surfaces.

5. The electrical component of claim 1, wherein conductive pathways and/or metal bodies are furnished with protruding projections as energy directors.

6. The electrical component of claim 1, wherein the individual metal body has a contacting element in the form of a male connector.

7. The electrical component of claim 1, wherein the connecting surfaces of the conductive pathways are each furnished with peripherally extending cooling surfaces.

8. A method of arranging an individual metal body on a conductive pathway of a flexible carrier material in which a connecting surface of the individual metal body and a connecting surface of the conductive pathway are materially bonded with each other, particularly to produce an electrical component according to claim 1, comprising the steps of:

forming one of the connecting surfaces to be joined by a film that is hilly furnished with conductive pathways;

forming energy directors made from aluminium integrated in the conductive pathway or the metal body;

bringing the connecting surfaces that are to be bonded into engagement with the conductive pathways of the film as rail profiles;

welding together the contact surfaces that touch each other using ultrasonic vibrations; and forming a contact element which is in the form of a push-button socket on the individual metal body.

9. The method of claim 8, wherein the welding step includes subjecting the connecting surfaces that are directly touching each other to at least one surface pressure application while they are being welded.

10. The method of claim 8, wherein the connecting surfaces are constructed from aluminum or an aluminium alloy.

11. The method of claim 8, wherein during the welding step the carrier material, fully furnished with conductive paths, is placed on a metal plate.

\* \* \* \* \*